(12) United States Patent
Kim et al.

(10) Patent No.: US 10,644,706 B1
(45) Date of Patent: May 5, 2020

(54) DATA AND CLOCK RECOVERY CIRCUIT

(71) Applicant: FARADAY TECHNOLOGY CORPORATION, Hsinchu (TW)

(72) Inventors: Young-Bok Kim, Hsinchu (TW); Andrew Chao, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/511,054

(22) Filed: Jul. 15, 2019

(51) Int. Cl.
*H03L 7/08* (2006.01)
*H03L 7/099* (2006.01)
*H03L 7/087* (2006.01)

(52) U.S. Cl.
CPC .......... *H03L 7/0807* (2013.01); *H03L 7/0802* (2013.01); *H03L 7/0995* (2013.01); *H03L 7/087* (2013.01)

(58) Field of Classification Search
CPC ....... H03L 7/087; H03L 7/0891; H03L 7/089; H03L 7/08; H03L 7/0992; H03L 7/18
USPC ........................................................ 375/376
See application file for complete search history.

(56) References Cited

U.S. PATENT DOCUMENTS

2007/0121772 A1* 5/2007 Wada ................. H03L 7/07
  375/371
2012/0051480 A1* 3/2012 Usugi .................... H03L 7/087
  375/376

* cited by examiner

*Primary Examiner* — Leila Malek
(74) *Attorney, Agent, or Firm* — Winston Hsu

(57) ABSTRACT

A data and clock recovery circuit includes a first selecting circuit, a high speed phase detector, a low speed phase detector, a charge pump, a voltage control oscillator and a frequency divider. The high speed phase detector generates a first phase difference signal according to the first reference clock signal and a divided clock signal or according to the data signal and the divided clock signal. The low speed phase detector generates a second phase difference signal according to a second reference clock signal and the divided clock signal. The charge pump generates a control voltage according to the first phase difference signal or the second phase difference signal. The voltage control oscillator receives the control voltage, and generates a recovered clock signal. The frequency divider receives the recovered clock signal, and generates the divided clock signal.

11 Claims, 10 Drawing Sheets

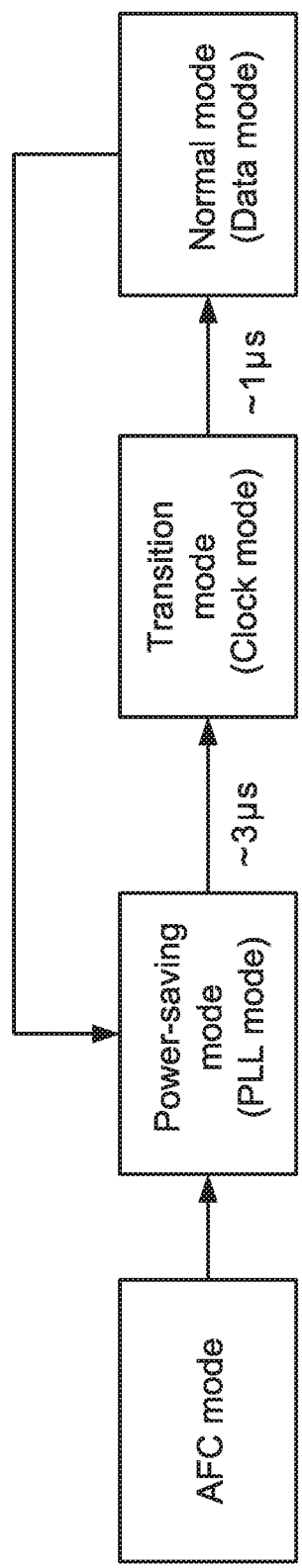

DATA AND CLOCK RECOVERY CIRCUIT

FIELD OF THE INVENTION

The present invention relates to a data and clock recovery circuit, and more particularly to a data and clock recovery circuit with low latency and low power consumption in a power-saving mode.

BACKGROUND OF THE INVENTION

In the high speed USB field or a PCIe field, a data and clock recovery (CDR) circuit is usually applied to a receiver (Rx) of a physical layer (PHY). In the high speed physical layer, the CDR circuit is operated in several power modes. For example, these power modes include a normal mode, a max power-saving mode, a medium power-saving mode and a power off mode. Generally, in the high speed physical layer, the operation mode of the CDR circuit is switched between the normal mode and the power-saving mode.

In this context, the term "latency" of the CDR circuit indicates the wake up time from sleep. Generally, the CDR circuit has high latency when the operation mode of the CDR circuit is switched from the max power-saving mode to the normal mode, and the CDR circuit has low latency when the operation mode of the CDR circuit is switched from the medium power-saving mode to the normal mode.

FIG. 1 is a schematic functional block diagram illustrating the architecture of a conventional CDR circuit. As shown in FIG. 1, the CDR circuit 100 comprises a high speed phase detector 110, a charge pump 120, a voltage control oscillator (VCO) 130 and a frequency divider 140.

The high speed phase detector 110 receives a divided clock signal CLKd and a data signal Data. According to the result of comparing the divided clock signal CLKd with the data signal Data, the high speed phase detector 110 generates a phase difference signal Spd. According to the phase difference signal Spd, the charge pump 120 generates a control voltage Vctrl. According to the control voltage Vctrl, the voltage control oscillator 130 generates a recovered clock signal CLKr. The frequency divider 140 receives the recovered clock signal CLKr. After the frequency of the recovered clock signal CLKr is divided by N, the frequency divider 140 generates the divided clock signal CLKd.

Moreover, the charge pump 120 may be replaced by a counter. For example, the counter receives the phase difference signal Spd from the high speed phase detector 110. If the phase difference signal Spd is positive, the counting value is counted up. Whereas, if the phase difference signal Spd is negative, the counting value is counted down. According to the counting value, the counter generates the corresponding control voltage Vctrl and transmits the control voltage Vctrl to the voltage control oscillator 130.

For example, in the CDR circuit of FIG. 1, the frequency of the data signal Data is in the range between 1 GHz and 28 GHz. Since the data signal Data is transferred at a high data rate, the circuitry of the high speed phase detector 110 is complicated. For example, the high speed phase detector 110 is at least equipped with a sense amplifier, a flip-flop device, a clock buffer, and so on. Since the number of the electronic components is large, some problems occur. When the CDR circuit 100 is operated in the normal mode, the energy consumed by the high speed phase detector 110 is appropriately 70% of the energy consumed by the whole CDR circuit 100.

Generally, when the operation mode of the conventional CDR circuit 100 is switched from the power off mode, the locking time exceeds 20 μs. For example, in the L0s or L1 state of the PCIe field, the conventional CDR circuit 100 has to be operated in the power-saving mode with the low latency. Consequently, the CDR circuit 100 cannot enter the power off mode.

For meeting the requirement of the low latency, the conventional CDR circuit 100 is almost fully turned on in the power-saving mode, and the conventional CDR circuit 100 works in the like-normal mode. That is, although the CDR circuit 100 is in the power-saving mode, the high speed phase detector 110 still works. Consequently, the power consumption of the CDR circuit 100 is very high.

SUMMARY OF THE INVENTION

An embodiment of the present invention provides a data and clock recovery circuit. The data and clock recovery circuit includes a first selecting circuit, a high speed phase detector, a low speed phase detector, a charge pump, a voltage control oscillator and a frequency divider. A first input terminal of the first selecting circuit receives a first reference clock signal. A second input terminal of the first selecting circuit receives a data signal. A control terminal of the first selecting circuit receives a mode selection signal. The high speed phase detector is connected with an output terminal of the first selecting circuit. The high speed phase detector generates a first phase difference signal according to the first reference clock signal and a divided clock signal, or the high speed phase detector generates the first phase difference signal according to the data signal and the divided clock signal. The low speed phase detector generates a second phase difference signal according to a second reference clock signal and the divided clock signal. A first input terminal of the second selecting circuit receives the first phase difference signal. A second input terminal of the second selecting circuit receives the second phase difference signal. A control terminal of the second selecting circuit receives the mode selection signal. The charge pump is connected with an output terminal of the second selecting circuit. The charge pump generates a control voltage according to the first phase difference signal, or the charge pump generates the control voltage according to the second phase difference signal. The voltage control oscillator receives the control voltage, and generates a recovered clock signal. The frequency divider receives the recovered clock signal, and generates the divided clock signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5B schematically illustrates the concept of switching the operation mode of the CDR circuit of FIG. 5A between various modes according to the present invention;

DETAILED DESCRIPTION OF PREFERRED EMBODIMENTS

Figure 1:
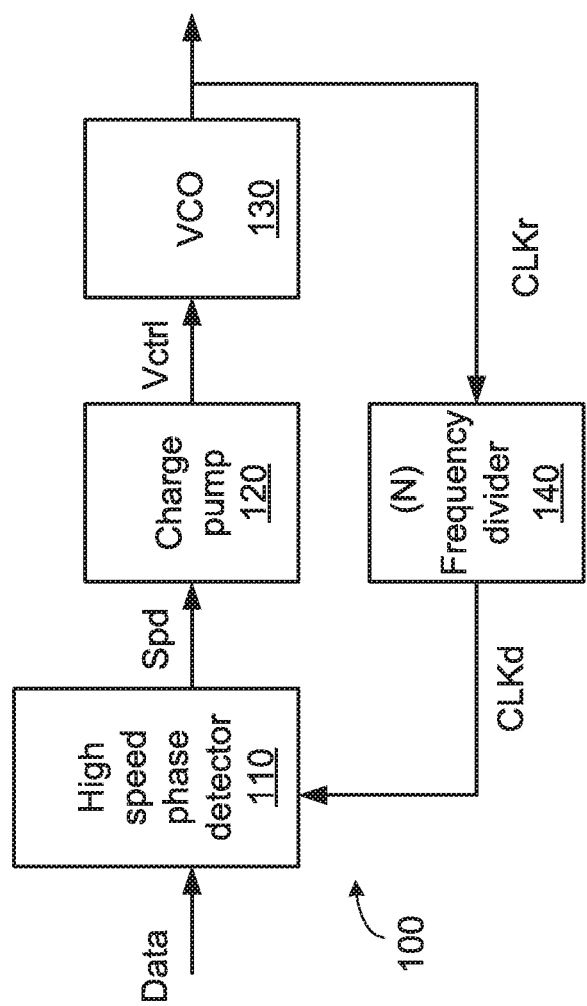
FIG. 1 (prior art) is a schematic functional block diagram illustrating the architecture of a conventional CDR circuit.
Figure 2:
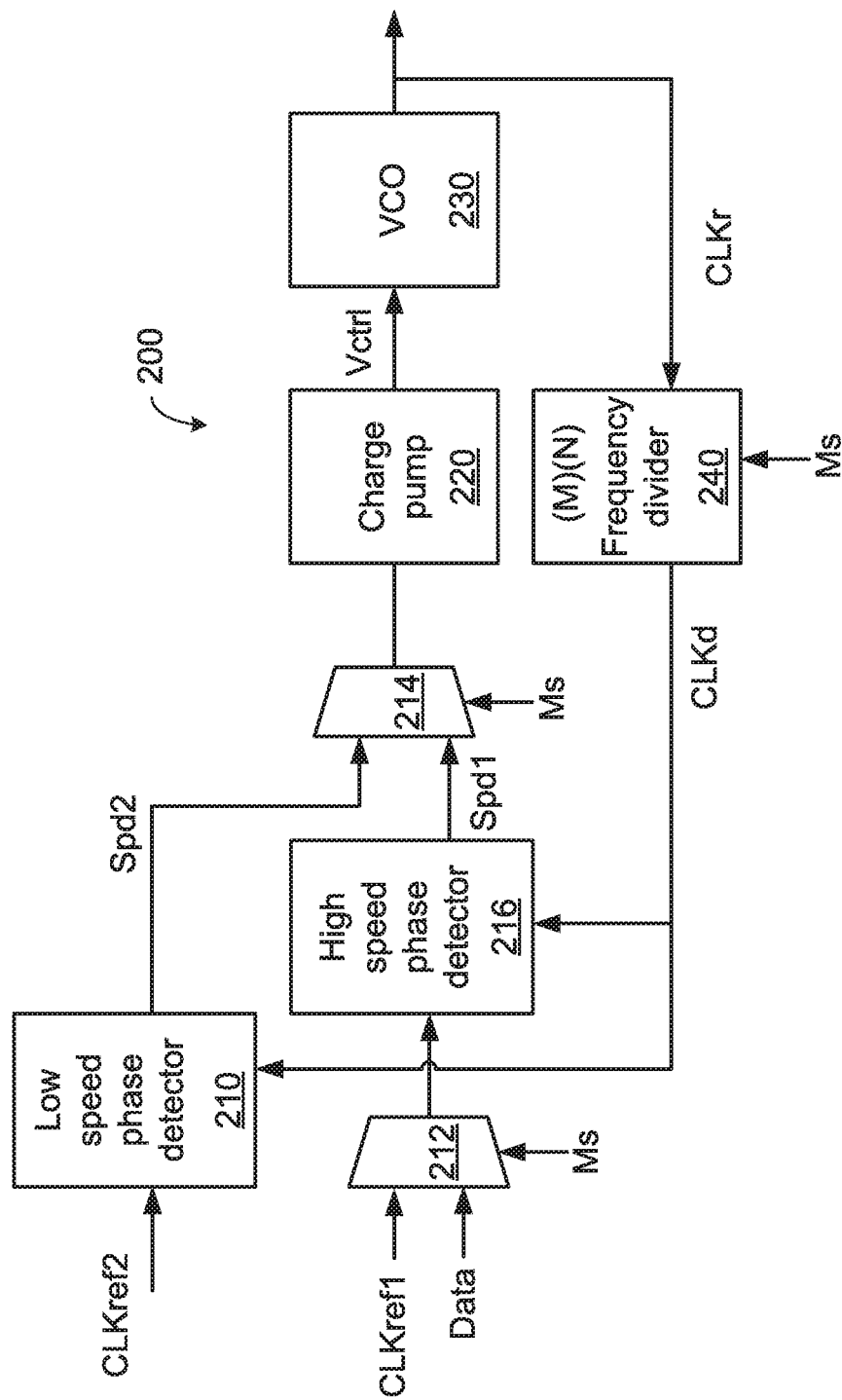
FIG. 2 is a schematic functional block diagram illustrating the architecture of a CDR circuit according to an embodiment of the present invention.

FIG. 2 is a schematic functional block diagram illustrating the architecture of a CDR circuit according to an embodiment of the present invention. As shown in FIG. 2, the CDR circuit 200 comprises a high speed phase detector 216, a low speed phase detector 210, a first selecting circuit 212, a second selecting circuit 214, a charge pump 220, a voltage control oscillator (VCO) 230 and a frequency divider 240. In an embodiment, the first selecting circuit 212 and the second selecting circuit 214 are multiplexers, the low speed phase detector 210 is a linear phase detector, and the high speed phase detector 216 is a bang-bang phase detector.

The two input terminals of the first selecting circuit 212 receives a first reference clock signal CLKref1 and a data signal Data, respectively. The control terminal of the first selecting circuit 212 receives a mode selection signal Ms. According to the mode selection signal Ms, one of the first reference clock signal CLKref1 and the data signal Data is selected by the first selecting circuit 212 and transmitted to the input terminal of the high speed phase detector 216.

The high speed phase detector 216 receives one of the first reference clock signal CLKref1 and the data signal Data. After the phase difference between the selected one of the first reference clock signal CLKref1 and the data signal Data and a divided clock signal CLKd is judged, the high speed phase detector 216 generates a first phase difference signal Spd1.

The low speed phase detector 210 receives a second reference clock signal CLKref2. After the phase difference between the second reference clock signal CLKref2 and the divided clock signal CLKd is judged, the low speed phase detector 210 generates a second phase difference signal Spd2.

The two input terminals of the second selecting circuit 214 receives the first phase difference signal Spd1 and the second phase difference signal Spd2, respectively. The control terminal of the second selecting circuit 214 receives the mode selection signal Ms. According to the mode selection signal Ms, one of the first phase difference signal Spd1 and the second phase difference signal Spd2 is selected by the second selecting circuit 214 and transmitted to the input terminal of the charge pump 220.

According to the selected one of the first phase difference signal Spd1 and the second phase difference signal Spd2, the charge pump 220 generates a control voltage Vctrl to the input terminal of the voltage control oscillator 230. According to the control voltage Vctrl, the voltage control oscillator 230 generates a recovered clock signal CLKr.

The control terminal of the frequency divider 240 receives the mode selection signal Ms. In an embodiment, the frequency divider 240 divides the recovered clock signal CLKr by a first divisor M according to the mode selection signal Ms, so that the divided clock signal CLKd is generated. In another embodiment, the frequency divider 240 divides the recovered clock signal CLKr by a second divisor N according to the mode selection signal Ms, so that the divided clock signal CLKd is generated.

The frequency of the first reference clock signal CLKref1 is higher than the frequency of the second reference clock signal CLKref2. For example, the frequency of the first reference clock signal CLKref1 is higher than 1 GHz (e.g., 2 GHz), and the frequency of the second reference clock signal CLKref2 is lower than 1 GHz (e.g., 100 MHz).

Figure 3A:
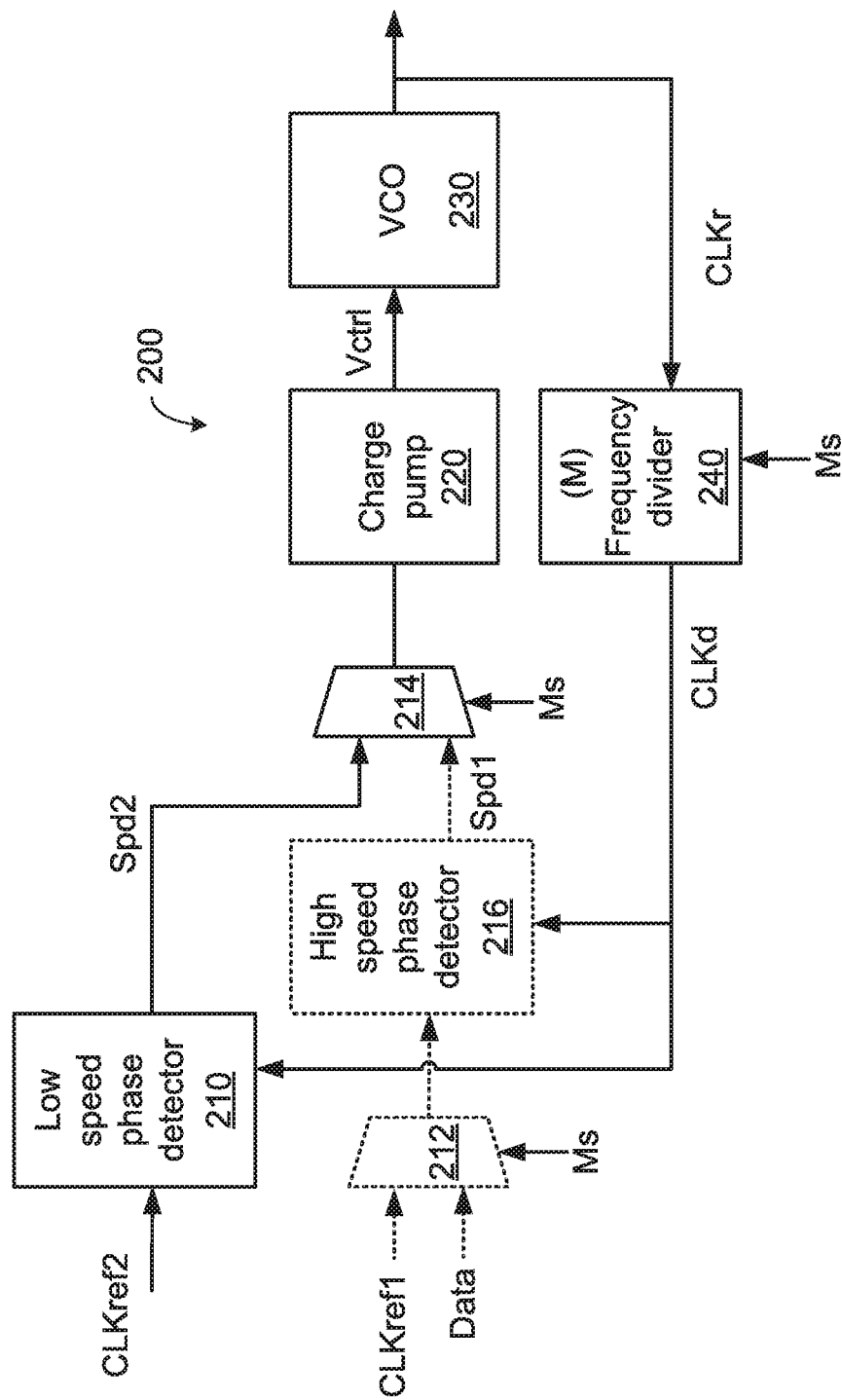
FIGS. 3A, 3B and 3C are schematic functional block diagrams illustrating the operations of the CDR circuit of the present invention in various operation modes.
Figure 3B:
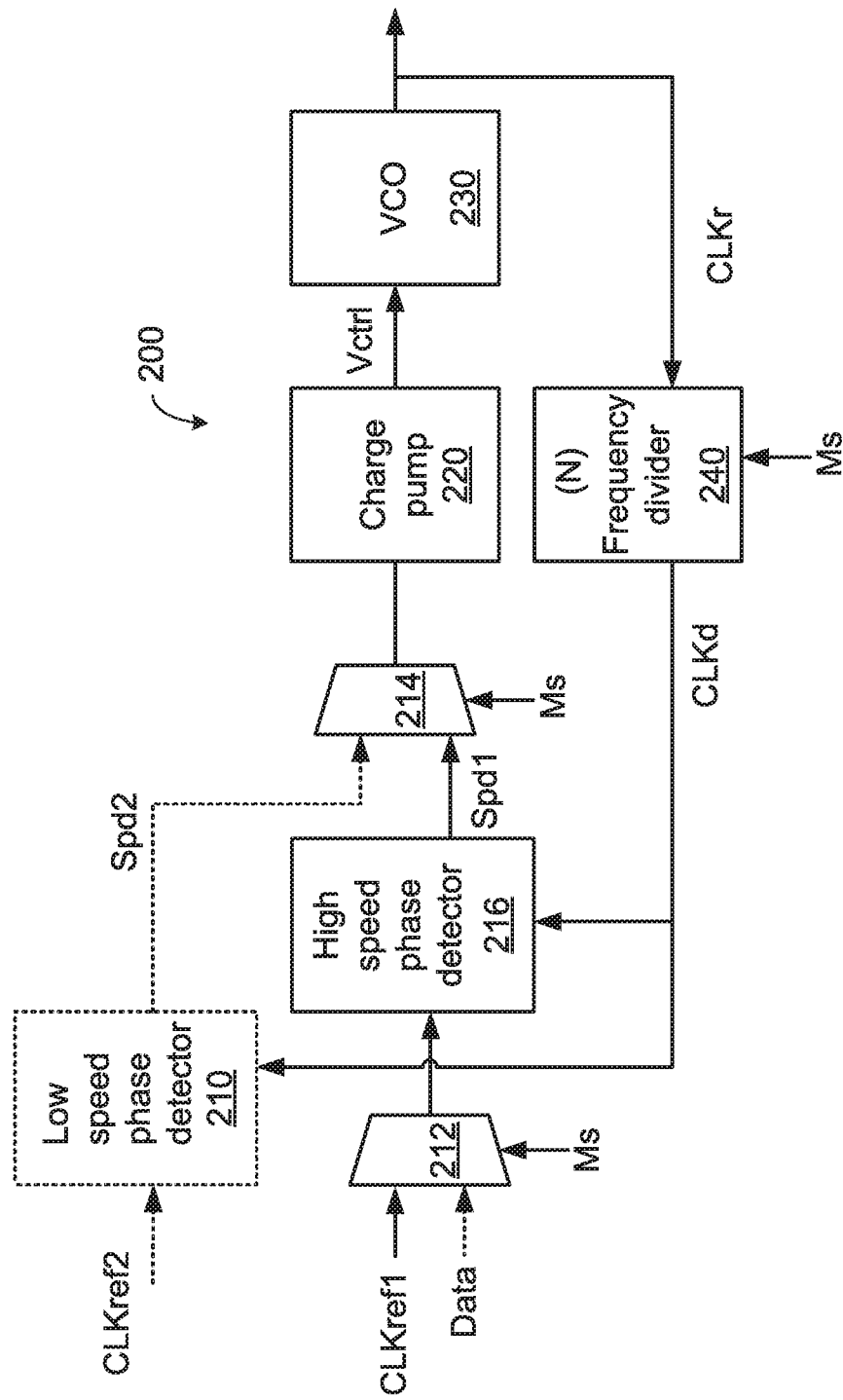
Figure 3C:
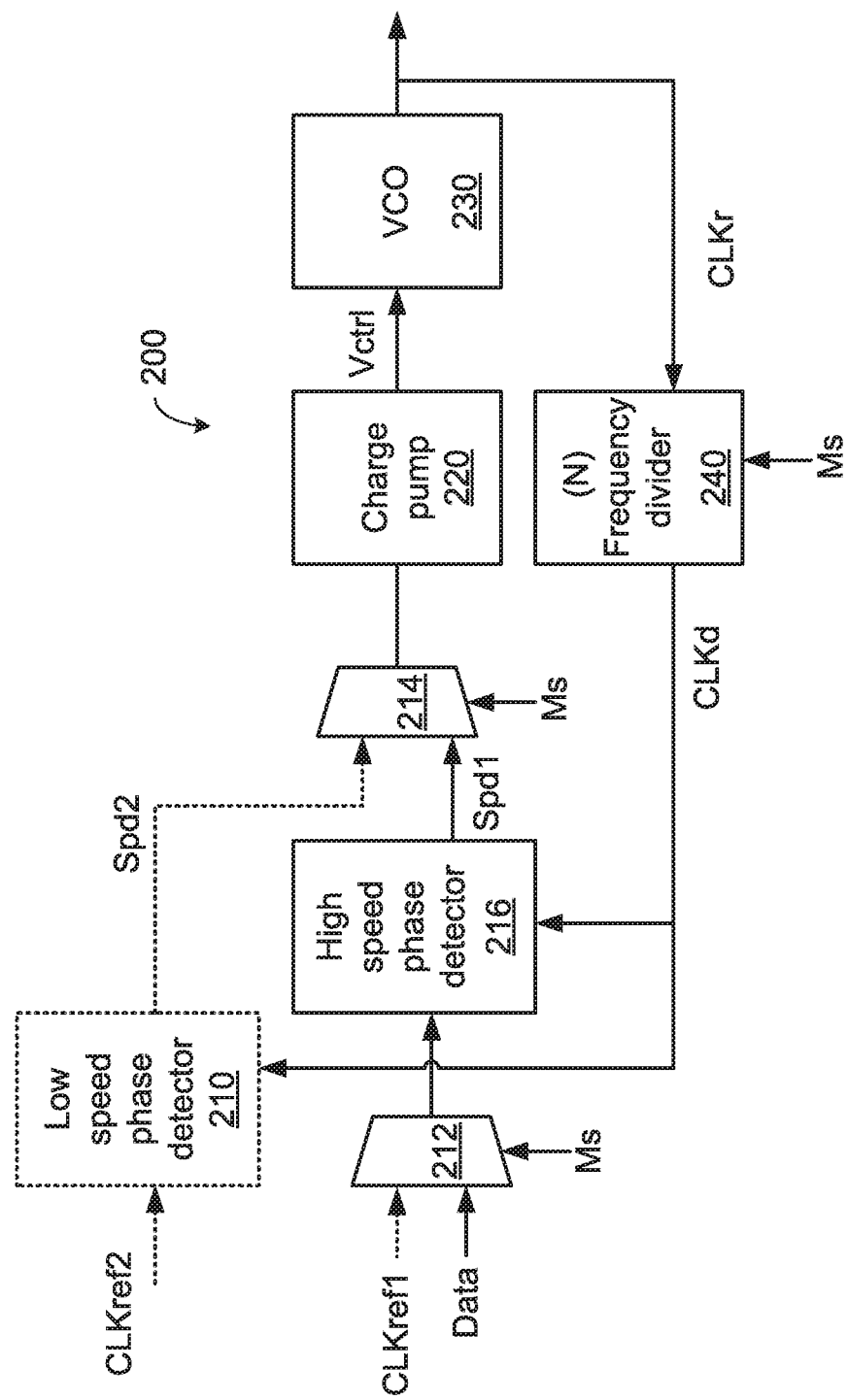

In accordance with the present invention, the CDR circuit 200 is operated in various operation modes according to the mode selection signal Ms. FIGS. 3A, 3B and 3C are schematic functional block diagrams illustrating the operations of the CDR circuit of the present invention in various operation modes.

As shown in FIG. 3A, the CDR circuit 200 is operated in a phase-locked loop (PLL) mode. Under this circumstance, no signal is outputted from the first selecting circuit 212, the high speed phase detector 216 is inactivated, and the first phase difference signal Spd1 is not outputted from the high speed phase detector 216. The frequency divider 240 provides the first divisor M. According to the second reference clock signal CLKref2 and the divided clock signal CLKd, the low speed phase detector 210 generates the second phase difference signal Spd2. In addition, the second phase difference signal Spd2 is selected by the second selecting circuit 214 and inputted into the charge pump 220.

According to the second phase difference signal Spd2, the charge pump 220 generates a control voltage Vctrl to the input terminal of the voltage control oscillator 230. According to the control voltage Vctrl, the voltage control oscillator 230 generates a recovered clock signal CLKr. After the frequency divider 240 divides the recovered clock signal CLKr by the first divisor M, the divided clock signal CLKd is generated.

When the CDR circuit 200 is operated in the phase-locked loop (PLL) mode, the frequency of the recovered clock signal CLKr generated by the voltage control oscillator 230 is locked to be M times the frequency of the second reference clock signal CLKref2.

Since the second reference clock signal CLKref2 is generated at a low data rate, the circuitry of the low speed phase detector 210 is simplified and the low speed phase detector 210 employs a small number of electronic components. Under this circumstance, the operations of the CDR circuit 200 are similar to the operations of the linear PLL circuit.

When the CDR circuit 200 is operated in the phase-locked loop (PLL) mode, the energy consumed by the low speed phase detector 210 is lower than 10% of the energy consumed by the whole CDR circuit 200. In other words, the phase-locked loop (PLL) mode of the CDR circuit 200 may be considered as a power-saving mode. In this embodiment, the energy consumed by the low speed phase detector 210 is very low, and the frequency of the voltage control oscillator 230 is maintained in the locked state.

As shown in FIG. 3B, the CDR circuit 200 is operated in a clock mode. Under this circumstance, the low speed phase detector 210 is inactivated, and the second phase difference signal Spd2 is not outputted from the low speed phase detector 210. In addition, the first reference clock signal CLKref1 is selected by the first selecting circuit 212 and inputted into the high speed phase detector 216. The frequency divider 240 provides the second divisor N. According to the first reference clock signal CLKref1 and the divided clock signal CLKd, the high speed phase detector 216 generates the first phase difference signal Spd1. In addition, the first phase difference signal Spd1 is selected by the second selecting circuit 214 and inputted into the charge pump 220.

According to the first phase difference signal Spd1, the charge pump 220 generates a control voltage Vctrl to the input terminal of the voltage control oscillator 230. According to the control voltage Vctrl, the voltage control oscillator 230 generates a recovered clock signal CLKr. After the frequency divider 240 divides the recovered clock signal CLKr by the second divisor N, the divided clock signal CLKd is generated.

In this embodiment, the clock mode is the transition mode between the power-saving mode and the normal mode. Consequently, the CDR circuit 200 is switched from the power-saving mode to the normal mode more stably.

In the clock mode, the data rate of the first reference clock signal CLKref1 is close to the data rate of the data signal Data. After the first reference clock signal CLKref1 is inputted into the high speed phase detector 216, the control voltage Vctrl generated by the charge pump 220 in the clock mode in similar to the control voltage Vctrl generated by the charge pump 220 in the normal mode.

In the clock mode, the frequency of the recovered clock signal CLKr generated by the voltage control oscillator 230 is locked to be N times the frequency of the first reference clock signal CLKref1.

Once the data signal Data is detected, the CDR circuit 200 enters a data mode. According to the mode selection signal Ms, the data signal Data is selected by the first selecting circuit 212 and inputted into the high speed phase detector 216. Moreover, the data mode of the CDR circuit 200 is the normal mode.

As shown in FIG. 3C, the CDR circuit 200 is operated in the data mode. Under this circumstance, the low speed phase detector 210 is inactivated, and the second phase difference signal Spd2 is not outputted from the low speed phase detector 210. The frequency divider 240 provides the second divisor N. According to the data signal Data and the divided clock signal CLKd, the high speed phase detector 216 generates the first phase difference signal Spd1. In addition, the first phase difference signal Spd1 is selected by the second selecting circuit 214 and inputted into the charge pump 220.

According to the first phase difference signal Spd1, the charge pump 220 generates a control voltage Vctrl to the input terminal of the voltage control oscillator 230. According to the control voltage Vctrl, the voltage control oscillator 230 generates a recovered clock signal CLKr. After the frequency divider 240 divides the recovered clock signal CLKr by the second divisor N, the divided clock signal CLKd is generated.

Figure 4:
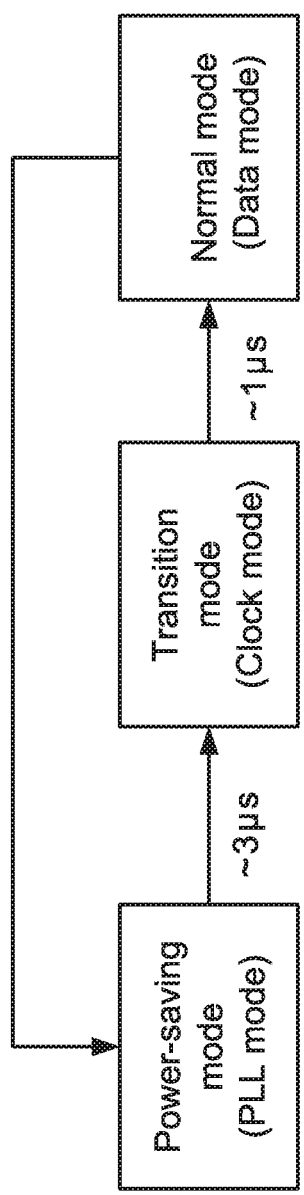
FIG. 4 schematically illustrates the concept of switching the operation mode of the CDR between the power-saving mode and the normal mode according to the present invention.

FIG. 4 schematically illustrates the concept of switching the operation mode of the CDR between the power-saving mode and the normal mode according to the present invention. In the power-saving mode (e.g., the phase-locked loop mode), the frequency of the voltage control oscillator 230 is locked according to the low frequency of the second reference clock signal CLKref2. Consequently, the power consumption of the CDR circuit 200 is very low.

In the transition mode (e.g., the clock mode), the frequency of the voltage control oscillator 230 is locked according to the high frequency of the first reference clock signal CLKref1. Consequently, the control voltage Vctrl of the CDR circuit 200 in the transition mode is similar to the control voltage Vctrl in the normal mode. Consequently, the CDR circuit 200 can be switched from the power-saving mode to the normal mode more stably and more quickly.

In a normal mode (e.g., the data mode), the CDR circuit 200 generates the recovered clock signal CLKr according to the data signal Data. Moreover, the operation mode of the CDR circuit 200 can be directly switched from the normal mode (e.g., the data mode) to the power-saving mode (e.g., the phase-locked loop mode).

The time period of switching the operation mode of the CDR circuit 200 will be described as follows. It takes about 3 us for switching the operation mode from the power-saving mode (e.g., the phase-locked loop mode) to the transition mode (e.g., the clock mode). It takes about 1 us for switching the operation mode from the transition mode (e.g., the clock mode) to the normal mode (e.g., the data mode). Consequently, the data and clock recovery circuit of the present invention has low latency and low power consumption in the power-saving mode.

In an embodiment, the first reference clock signal CLKref1 and the second reference clock signal CLKref2 are generated by the same clock source. For example, the clock source generates the high-frequency first reference clock signal CLKref1. After the first reference clock signal CLKref1 is processed by another frequency divider, the low-frequency second reference clock signal CLKref2 is generated.

Moreover, the charge pump 220 may be replaced by a counter. For example, the counter receives the first phase difference signal or the second phase difference signal. If the first phase difference signal or the second phase difference signal is positive, the counting value is counted up. Whereas, if the first phase difference signal or the second phase difference signal is negative, the counting value is counted down. According to the counting value, the counter generates the corresponding control voltage Vctrl and transmits the control voltage Vctrl to the voltage control oscillator 230.

Figure 5A:
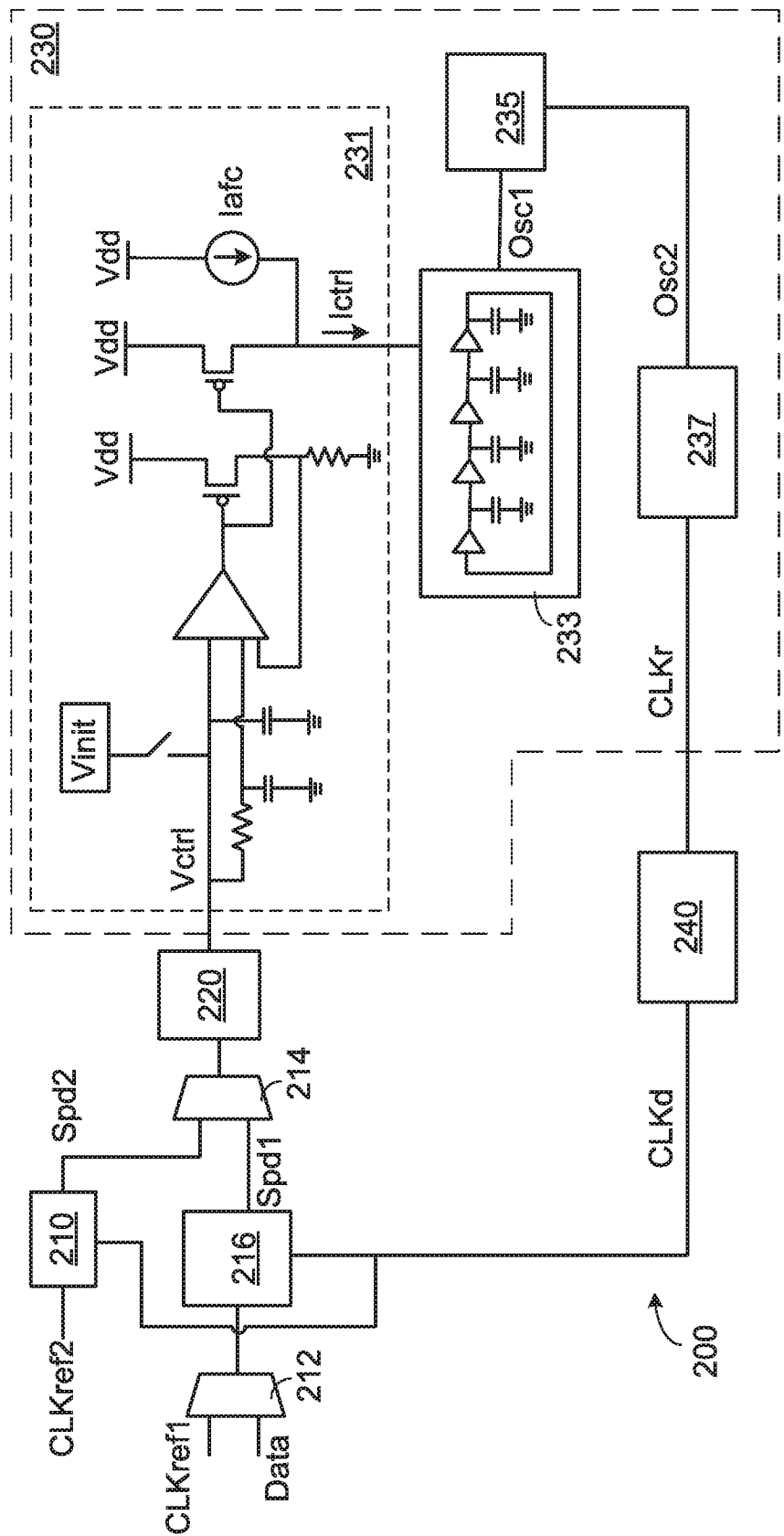
FIG. 5A is a schematic circuit diagram illustrating an example of the voltage control oscillator of the CDR circuit according to the embodiment of the present invention.

FIG. 5A is a schematic circuit diagram illustrating an example of the voltage control oscillator of the CDR circuit according to the embodiment of the present invention. FIG. 5B schematically illustrates the concept of switching the operation mode of the CDR circuit of FIG. 5A between various modes according to the present invention.

The voltage control oscillator 230 comprises a voltage/current converter (also referred as a V/I converter) 231, a ring oscillator 233, a duty cycle calibration circuit 235 and a quantum error collection circuit 237.

The V/I converter 231 is used for converting the control voltage Vctrl to a control current Ictrl. According to the control current Ictrl, the ring oscillator 233 generates a first oscillation signal Osc1. After the first oscillation signal Osc1 is calibrated by the duty cycle calibration circuit 235, a second oscillation signal Osc2 is generated. The quantum error collection circuit 237 is used for correcting the distortion in the second oscillation signal Osc2 and generating the recovered clock signal CLKr.

In an embodiment, the V/I converter 231 comprises an initial voltage source Vinit and an initial current source Iafc. When the CDR circuit 200 receives the electric power and an initiation process is started, the CDR circuit 200 is in an automatic frequency control mode (AFC) mode.

When the CDR circuit 200 is in the automatic frequency control mode (AFC) mode, the CDR circuit 200 performs an open loop target frequency searching process. Under this circumstance, the high speed phase detector 216 and the low speed phase detector 210 do not provide the phase difference signal. In addition, the initial voltage source Vinit provides the control voltage, and the initial current source Iafc provides an initial current to the ring oscillator 233.

Please refer to FIG. 5B. When the CDR circuit 200 receives the electric power and the initiation process is started, the CDR circuit 200 is in the automatic frequency control mode (AFC) mode. After the ring oscillator 233 generates the stable first oscillation signal Osc1, the CDR circuit 200 enters the power-saving mode (e.g., the phase-locked loop mode). In addition, the initial voltage source Vinit does not provide the control voltage, and the initial current source Iafc does not provide the initial current. Then, the CDR circuit 200 enters the transition mode (e.g., the clock mode) and the normal mode (e.g., the data mode) sequentially.

Figure 6A:
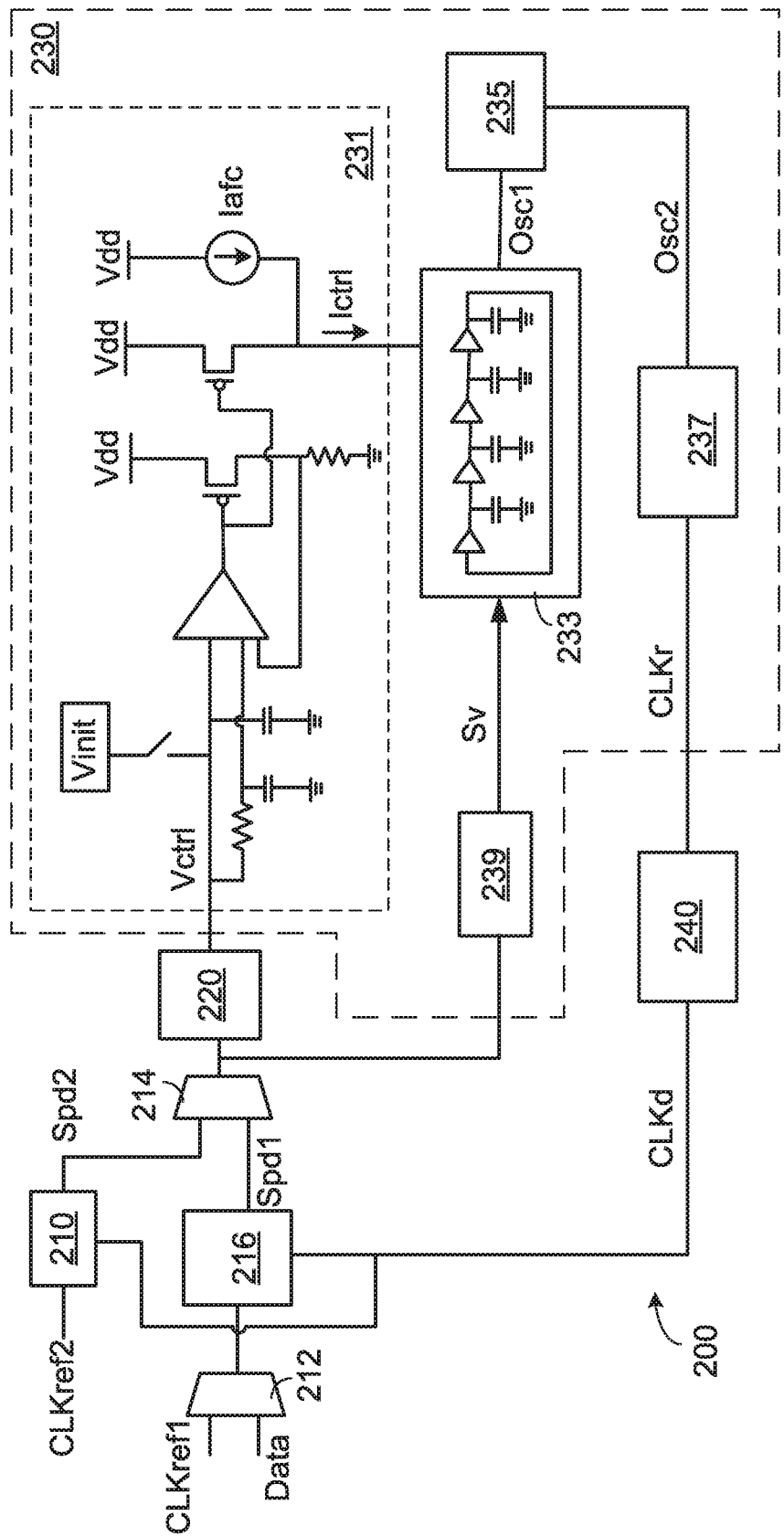
FIG. 6A is a schematic circuit diagram illustrating another example of the voltage control oscillator of the CDR circuit according to the embodiment of the present invention.
Figure 6B:
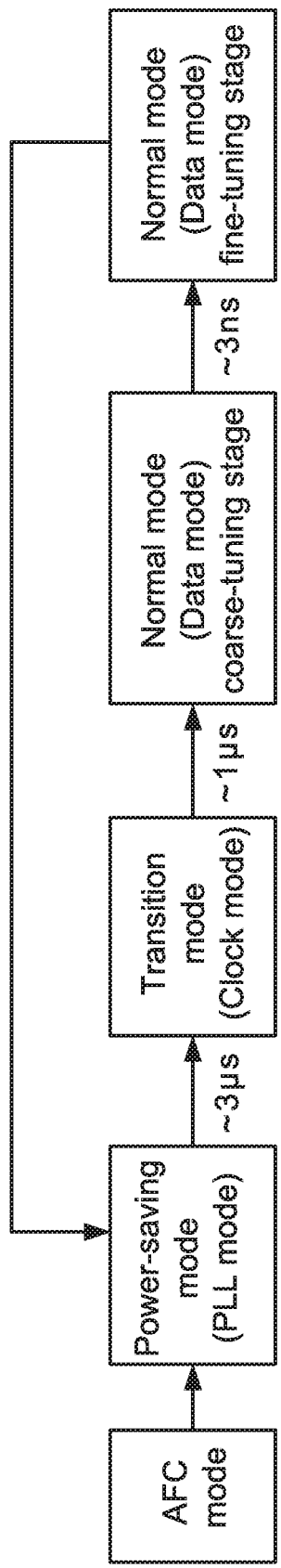
FIG. 6B schematically illustrates the concept of switching the operation mode of the CDR circuit of FIG. 6A between various modes according to the present invention.

FIG. 6A is a schematic circuit diagram illustrating another example of the voltage control oscillator of the CDR circuit according to the embodiment of the present invention. FIG. 6B schematically illustrates the concept of switching the operation mode of the CDR circuit of FIG. 6A between various modes according to the present invention.

In comparison with FIG. 5A, the voltage control oscillator 230 of FIG. 6A further comprises an up/down voter 239. The up/down voter 239 is connected with the ring oscillator 233. Consequently, a proportion path is defined by the up/down voter 239 to quickly adjust the phase of the first oscillation signal Osc1. When the CDR circuit 200 is in the normal mode, the up/down voter 239 is activated to receive the second phase difference signal Spd2 and generates a voting signal Sv.

In the initial stage of the normal mode, the up/down voter 239 provides a proportion path with a higher gain to control the ring oscillator 233. Consequently, the voltage control oscillator 230 coarsely tunes the frequency of the recovered clock signal CLKr to be close to the target frequency. Then, the up/down voter 239 provides a proportion path with a lower gain to control the ring oscillator 233. Consequently, the voltage control oscillator 230 finely tunes the recovered clock signal CLKr according to the control current Ictrl.

Please refer to FIG. 6B. After the CDR circuit 200 receives the electric power, the CDR circuit 200 enters the automatic frequency control mode (AFC) mode, the power-saving mode (e.g., the phase-locked loop mode) and the transition mode (e.g., the clock mode) sequentially. Then, the CDR circuit 200 enters the coarse-tuning stage of the normal mode. After about 3 ns, the CDR circuit 200 enters the fine-tuning stage of the normal mode. Consequently, the recovered clock signal CLKr is generated.

From the above descriptions, the present invention provides a CDR circuit. While the operation mode of the CDR circuit is switched from the power-saving mode (e.g., the phase-locked loop mode) to the normal mode (e.g., the data mode), the CDR circuit enters the transition mode (e.g., the clock mode). Consequently, the CDR circuit can be switched from the power-saving mode to the normal mode more stably and more quickly. In other words, the data and clock recovery circuit of the present invention has low latency and low power consumption in the power-saving mode.

The examples of the voltage control oscillator of the CDR circuit are not restricted. It is noted that numerous modifications and alterations may be made while retaining the teachings of the invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data and clock recovery circuit, comprising:
   a first selecting circuit, wherein a first input terminal of the first selecting circuit receives a first reference clock signal, a second input terminal of the first selecting circuit receives a data signal, and a control terminal of the first selecting circuit receives a mode selection signal;
   a high speed phase detector connected with an output terminal of the first selecting circuit, wherein the high speed phase detector generates a first phase difference signal according to the first reference clock signal and a divided clock signal, or the high speed phase detector generates the first phase difference signal according to the data signal and the divided clock signal;
   a low speed phase detector generating a second phase difference signal according to a second reference clock signal and the divided clock signal;
   a second selecting circuit, wherein a first input terminal of the second selecting circuit receives the first phase difference signal, a second input terminal of the second selecting circuit receives the second phase difference signal, and a control terminal of the second selecting circuit receives the mode selection signal;
   a charge pump connected with an output terminal of the second selecting circuit, wherein the charge pump generates a control voltage according to the first phase difference signal, or the charge pump generates the control voltage according to the second phase difference signal;
   a voltage control oscillator receiving the control voltage, and generating a recovered clock signal; and
   a frequency divider receiving the recovered clock signal, and generating the divided clock signal.

2. The data and clock recovery circuit as claimed in claim 1, wherein when the data and clock recovery circuit is in a power-saving mode, the high speed phase detector is inactivated, the low speed phase detector generates the second phase difference signal according to the second reference clock signal and the divided clock signal, and the second phase difference signal is transmitted to the charge pump through the second selecting circuit.

3. The data and clock recovery circuit as claimed in claim 2, wherein the frequency divider divides the recovered clock signal by a first divisor according to the mode selection signal, so that the divided clock signal is generated.

4. The data and clock recovery circuit as claimed in claim 1, wherein when the data and clock recovery circuit is in a transition mode, the low speed phase detector is inactivated, the high speed phase detector generates the first phase difference signal according to the first reference clock signal and the divided clock signal, and the first phase difference signal is transmitted to the charge pump through the second selecting circuit.

5. The data and clock recovery circuit as claimed in claim 4, wherein the frequency divider divides the recovered clock signal by a second divisor according to the mode selection signal, so that the divided clock signal is generated.

6. The data and clock recovery circuit as claimed in claim 1, wherein when the data and clock recovery circuit is in a normal mode, the low speed phase detector is inactivated, the high speed phase detector generates the first phase difference signal according to the data signal and the divided clock signal, and the first phase difference signal is transmitted to the charge pump through the second selecting circuit.

7. The data and clock recovery circuit as claimed in claim 6, wherein the frequency divider divides the recovered clock signal by a second divisor according to the mode selection signal, so that the divided clock signal is generated.

8. The data and clock recovery circuit as claimed in claim 1, wherein the voltage control oscillator comprises:
   a voltage/current converter receiving the control voltage, and converting the control voltage into a control current;
   a ring oscillator receiving the control current, and generating a first oscillation signal;
   a duty cycle calibration circuit receiving the first oscillation signal, wherein the duty cycle calibration circuit adjusts a duty cycle of the first oscillation signal, so that a second oscillation signal is generated; and
   a quantum error collection circuit receiving the second oscillation signal, wherein the quantum error collection circuit corrects a distortion in the second oscillation signal, so that the recovered clock signal is generated.

9. The data and clock recovery circuit as claimed in claim 8, wherein the voltage control oscillator further comprises an up/down voter, wherein the up/down voter is connected between the output terminal of the second selecting circuit and the ring oscillator, so that a proportion path is defined.

10. The data and clock recovery circuit as claimed in claim 9, wherein when the data and clock recovery circuit is in a coarse-tuning stage of a normal mode, the up/down voter provides the proportion path with a higher gain, so that the voltage control oscillator coarsely tunes a frequency of the recovered clock signal to be close to a target frequency.

11. The data and clock recovery circuit as claimed in claim 10, wherein when the data and clock recovery circuit is in a fine-tuning stage of the normal mode, the up/down voter provides the proportion path with a lower gain, so that the voltage control oscillator finely tunes the recovered clock signal according to the control current.

\* \* \* \* \*